(12) United States Patent
Yu et al.

(10) Patent No.: US 11,157,382 B2
(45) Date of Patent: Oct. 26, 2021

(54) OBTAINING OF STATISTICAL PERFORMANCE OF STORAGE SYSTEM

(71) Applicant: EMC IP Holding Company LLC, Hopkinton, MA (US)

(72) Inventors: Chark Wenshuai Yu, Shanghai (CN); Ao Sun, Shanghai (CN); You Chen, Shanghai (CN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 17 days.

(21) Appl. No.: 16/731,924

(22) Filed: Dec. 31, 2019

(65) Prior Publication Data

US 2021/0004307 A1   Jan. 7, 2021

(30) Foreign Application Priority Data

Jul. 5, 2019   (CN) .......................... 201910606496.X

(51) Int. Cl.
| | |
|---|---|
| *G06F 11/34* | (2006.01) |
| *G11C 11/56* | (2006.01) |
| *G06F 3/06* | (2006.01) |
| *G11C 16/04* | (2006.01) |
| *G11C 29/52* | (2006.01) |

(52) U.S. Cl.
CPC .......... *G06F 11/3409* (2013.01); *G06F 3/067* (2013.01); *G06F 3/0614* (2013.01); *G06F 3/0653* (2013.01); *G06F 11/3452* (2013.01); *G11C 11/5628* (2013.01); *G11C 16/0483* (2013.01); *G11C 29/52* (2013.01)

(58) Field of Classification Search
CPC .. G06F 3/067; G06F 11/3452; G06F 11/3409; G06F 3/0653; G06F 3/0614; G11C 29/52; G11C 16/0483; G11C 29/56008; G11C 11/5628
See application file for complete search history.

(56) References Cited

U.S. PATENT DOCUMENTS

| | | | |
|---|---|---|---|
| 9,773,026 B1* | 9/2017 | Tetreault ................ | G06F 11/30 |
| 2005/0049831 A1* | 3/2005 | Lilly ....................... | G07C 3/12 |
| | | | 702/182 |
| 2007/0005297 A1* | 1/2007 | Beresniewicz ... | G05B 23/0235 |
| | | | 702/181 |

* cited by examiner

*Primary Examiner* — Guy J Lamarre
(74) *Attorney, Agent, or Firm* — Amin, Turocy & Watson, LLP

(57) ABSTRACT

Obtaining or facilitating obtaining statistical performance of a storage system is described. For instance, a method comprises: dividing a value range of performance of a storage system into a plurality of adjacent sub-ranges, an upper limit value of each sub-range being a predetermined multiple of a non-zero lower limit value of the sub-range. The method also comprises: determining a distribution of a plurality of measurement values of the performance among the plurality of sub-ranges. The method further comprises: estimating, based on the distribution, a percentile of the plurality of measurement values corresponding to a predetermined percentage to indicate statistical performance of the storage system. As a result, statistical performance indicators of the storage system can be obtained with an acceptable error using a small amount of memory resources.

20 Claims, 6 Drawing Sheets

OBTAINING OF STATISTICAL PERFORMANCE OF STORAGE SYSTEM

RELATED APPLICATION

The present application claims the benefit of priority to Chinese Patent Application No. 201910606496.X, filed on Jul. 5, 2019, which application is hereby incorporated into the present application by reference herein in its entirety.

FIELD

Embodiments of the present disclosure generally relate to computer systems or storage systems, and more particularly, to a computer-implemented method, an electronic device and a computer program product that obtain or facilitate obtaining statistical performance of such systems.

BACKGROUND

At present, various storage service providers offer a wide range of data storage services to storage users. Among these storage services, one of the latest products is the elastic cloud storage service (ECS), which is a distributed storage system. The storage service provided by the elastic cloud storage service is one of key service level agreements with customers.

A storage performance issue is generally hard to track and figure out in a distributed system. It is because multiple components or services are involved to fulfill a storage service request. Therefore, statistical performance (for example, a percentile of performance measurement values) of a storage system is often used to assist in finding out a root cause of performance issues of the storage system. However, traditional approaches for obtaining the statistical performance of a storage system may consume considerable memory resources or computing resources, which may result in adverse effects on the performance of the storage system in many scenarios.

SUMMARY

Embodiments of the present disclosure relates to a technical solution of obtaining statistical performance of a storage system at low system resource occupation.

In a first aspect of the present disclosure, there is provided a computer-implemented method. The method comprises: dividing a value range of performance of a storage system into a plurality of adjacent sub-ranges, an upper limit value of each sub-range being a predetermined multiple of a non-zero lower limit value of the sub-range. The method also comprises: determining a distribution of a plurality of measurement values of the performance among the plurality of sub-ranges. The method further comprises: estimating, based on the distribution, a percentile of the plurality of measurement values corresponding to a predetermined percentage to indicate statistical performance of the storage system.

In a second aspect of the present disclosure, there is provided an electronic device. The electronic device includes at least one processor and at least one memory storing computer program instructions. The at least one memory and the computer program instructions are configured, with the at least one processor, to cause the electronic device to: divide a value range of performance of a storage system into a plurality of adjacent sub-ranges, an upper limit value of each sub-range being a predetermined multiple of a non-zero lower limit value of the sub-range. The at least one memory and the computing program instructions are also configured, with the at least one processor, to cause the electronic device to: determine a distribution of a plurality of measurement values of the performance among the plurality of sub-ranges. The at least one memory and the computing program instructions are further configured, with the at least one processor, to cause the electronic device to: estimate, based on the distribution, a percentile of the plurality of measurement values corresponding to a predetermined percentage to indicate statistical performance of the storage system.

In a third aspect of the present disclosure, there is provided a computer program product. The computer program product is tangibly stored on a non-volatile computer-readable medium and including machine-executable instructions. The machine-executable instructions, when executed, cause a machine to perform steps of the method according to the first aspect.

It should be appreciated that the contents described in the Summary are not intended to define key or essential features of the embodiments of the present disclosure, or limit the scope of the present disclosure. Other features of the present disclosure will be understood more easily through the following description.

BRIEF DESCRIPTION OF THE DRAWINGS

Through reviewing the following detailed description with reference to the accompanying drawings, the above and other objectives, features and advantages of embodiments of the present disclosure will become more apparent. In the drawings, several embodiments are illustrated in an exemplary and non-restrictive manner, wherein.

Figure 1:
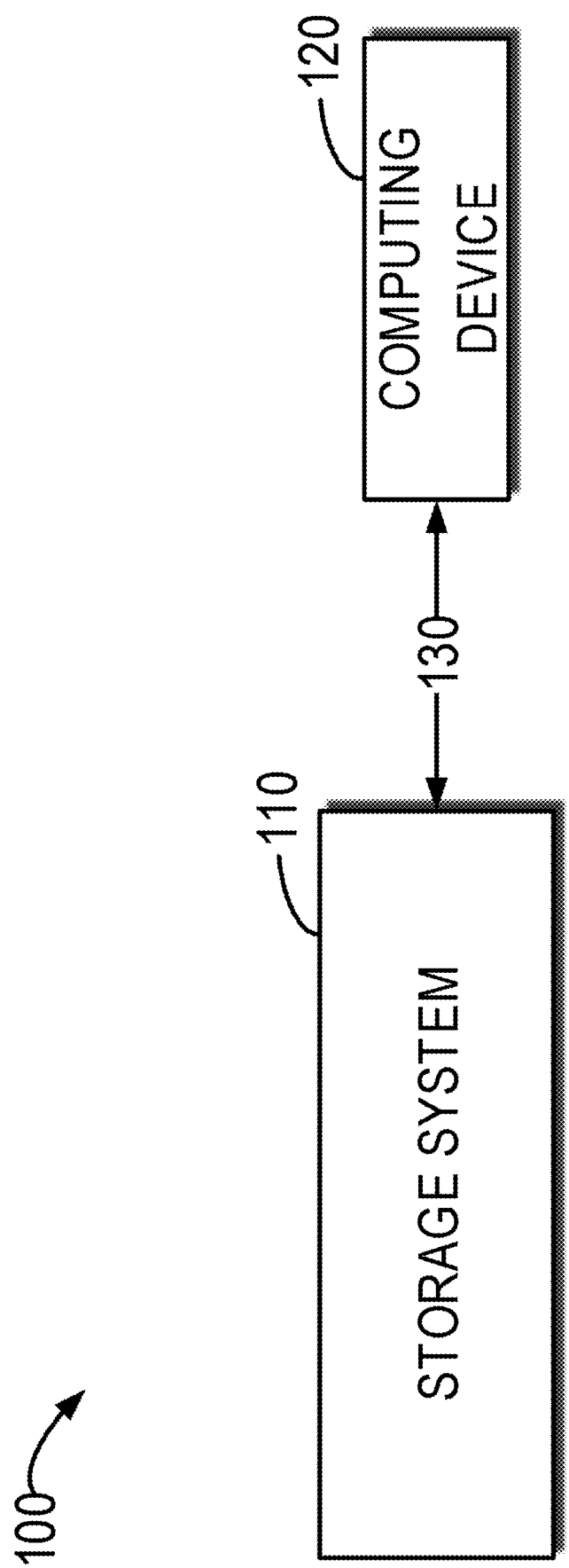
FIG. 1 illustrates a schematic diagram of an exemplary storage system environment in which embodiments of the present disclosure can be implemented.

Throughout all the drawings, same or similar reference signs are used to represent same or similar components.

DETAILED DESCRIPTION OF EMBODIMENTS

Principles and spirits of the present disclosure will now be described with reference to several exemplary embodiments illustrated in the drawings. It would be appreciated that description of those specific embodiments is merely for purpose of enabling those skilled in the art to better understand and further implement the present disclosure without suggesting any limitation to the scope disclosed herein in any manner.

FIG. 1 illustrates a schematic diagram of an exemplary storage system environment 100 in which embodiments of the present disclosure can be implemented. As shown in FIG. 1, the storage system environment 100 includes a storage system 110 and a computing device 120. The storage system 110 and the computing device 120 may communicate with each other via a communication link 130. For example, the computing device 120 may obtain, via the communication link 130, various information of the storage system 110, such as measurement values of performance of the storage system 110, or the like. Additionally or alternatively, the computing device 120 can also obtain information related to the storage system 110 from other units or components (not shown) in the storage system environment 100.

On the other hand, the computing device 120 can send a control signal to the storage system 110 via the communication link 130 to achieve various controls, managements and operations over the storage system 110. Additionally or alternatively, the computing device 120 may also be connected simultaneously to and control other storage devices or storage systems (not shown) in cooperation with the storage system 110, for example, other storage systems belonging to the same service provider as the storage system 110. It would be understood that although the computing device 120 is depicted as external to the storage system 110 in FIG. 1, in some embodiments, the computing device 120 may also be included in the storage system 110 as its integral part.

In some embodiments, the storage system 110 may be a cloud storage system, for example, an elastic cloud storage system. In other embodiments, the storage system 110 may also be any systems having a storage feature and providing storage services or functions to users. In some embodiments, the storage system 110 may provide storage functions using various types of devices with a storage feature, including but not limited to, a hard disk drive (HDD), a solid state disk (SSD), a removable disk, a compact disk (CD), a laser disk, an optical disk, a digital versatile disk (DVD), a floppy disk, a blue-ray disk, a serial attached small computer system interface (SCSI) storage disk (SAS), a serial advanced technology attachment (SATA) storage disk, any other magnetic storage devices and any other optical storage devices or combinations thereof.

Similarly, the computing device 120 may include any devices capable of implementing computing functions and/or control functions, including but not limited to, a dedicated computer, a general-purpose computer, a general-purpose processor, a microprocessor, a microcontroller or a state machine. The computing device 120 may also be implemented as an individual computing device or a combination of computing devices, for example, a combination of DSP and microprocessor, a plurality of microprocessors, one or more microprocessors in combination of DSP cores or any other similar configurations.

Moreover, the communication link 130 may be a connection or coupling in any forms capable of enabling communications between the storage system 110 and the computing device 120, including but not limited to, a coaxial cable, an optic fiber cable, a twisted pair, or wireless technologies (such as infrared, radio or microwave technologies). In some embodiments, the communication link 130 may include various types of buses. In other embodiments, the communication link 130 may contain a computer network, a communication network or other networks.

It should be appreciated that FIG. 1 only schematically illustrates units, modules or components associated with the embodiments of the present disclosure in the storage system environment 100. In practice, the storage system environment 100 may also include other units, modules or components used for other functions. Accordingly, embodiments of the present disclosure are not limited to specific devices, units, modules or components depicted in FIG. 1, and instead are generally applicable to any storage system environments including a storage system and a computing device.

As indicated above, traditional approaches for obtaining statistical performance of a storage system may consume a large amount of memory resources or computing resources, and may result in adverse effects on the performance of the storage system in many scenarios. Specifically, a storage system currently uses a self-implemented performance diagnostic system, namely, the Performance Counter System, to track individual performance metrics of different sub-components and functions in the storage system. The performance counter system periodically records performance data of performance counters on storage system components, calculates and analyzes the performance data provided by the counters to obtain performance status of the storage system. In general, the performance counter system only provides finite metrics, for example, average metrics, minimum metrics or maximum metrics.

When the storage system encounters rare or weird performance issues, the current finite metrics of the performance counter system may be insufficient to find a root cause for the performance issues. In this case, performance percentile metrics of the storage system may be utilized to further research and investigate these performance issues. As used herein a percentile of performance measurement values of a storage system may refer to a statistical metric of performance of the storage system, which may indicate statistical performance of the storage system.

More generally, the percentile may refer to a statistical term explained as follows. If a group of data is ranked from small to large and corresponding accumulated percentile ranks are calculated, a value of the data corresponding to a given percentile rank is called as the percentile of the given percentile rank. In other words, the percentile may be represented as: when a group of n observation values are ranked by the size of numeric value, a value at position p % is known as p-th percentile.

As a metric for measuring a position of data, the percentile does not necessarily measure a central position. The percentile provides information regarding how relevant data items are distributed between a minimum value and a maximum value. For data without too much duplication, the p-th percentile divides the data into two parts. Approximately p % of data items has values below the p-th percentile while about (100–p) % of data items have values greater than the p-th percentile. The p-th percentile can be defined as such a value which causes at least p % of data items to be below or equal to the value and at least (100–p) % of data items to be greater than or equal to the value.

Traditional approaches of obtaining a storage system performance percentile mostly store all performance measurement values in a memory and then accurately calculate the percentile based on a list of the ranked measurement values. Such a traditional calculation manner requires considerable system resources, such as, memory resources and computing resources. For example, given that the storage system has tens of thousands of performance counters, some of which contain massive performance measurement values, it will bring significant overheads of memory resources by storing the performance measurement values of all these performance counters into the memory. Therefore, the traditional manner of calculating the performance percentile may not be able to be applied directly into an existing performance counter system.

In a word, a performance percentile may be introduced to analyze or find out performance issues in a storage system, particularly in a distributed storage system. However, the traditional manner of calculating the performance percentile requires accurately obtaining and storing the performance measurement values measured by each performance counter. When tens of thousands of performance counters (or more) in a storage system (for example, a distributed storage system) are tracked, the traditional manner of calculating the performance percentile requires consuming considerable system resources, such as memory resources or computing resources, and thus bringing an adverse effect on the performance of the storage system.

In view of the above issues and other potential issues in the traditional solution, embodiments of the present disclosure provide a technical solution for obtaining statistical performance of a storage system. Compared with the traditional manner of calculating the statistical performance (for example, a performance percentile), embodiments of the present disclosure require much fewer system resources (for example, memory resources or computing resources) and provide an estimated value of the statistical performance within a predetermined error range. In other words, embodiments of the present disclosure can obtain statistical performance indicators of the storage system with an acceptable error using a small amount of system resources. Some example embodiments of the present disclosure are described in details below with reference to FIGS. 2 to 6.

Figure 2:
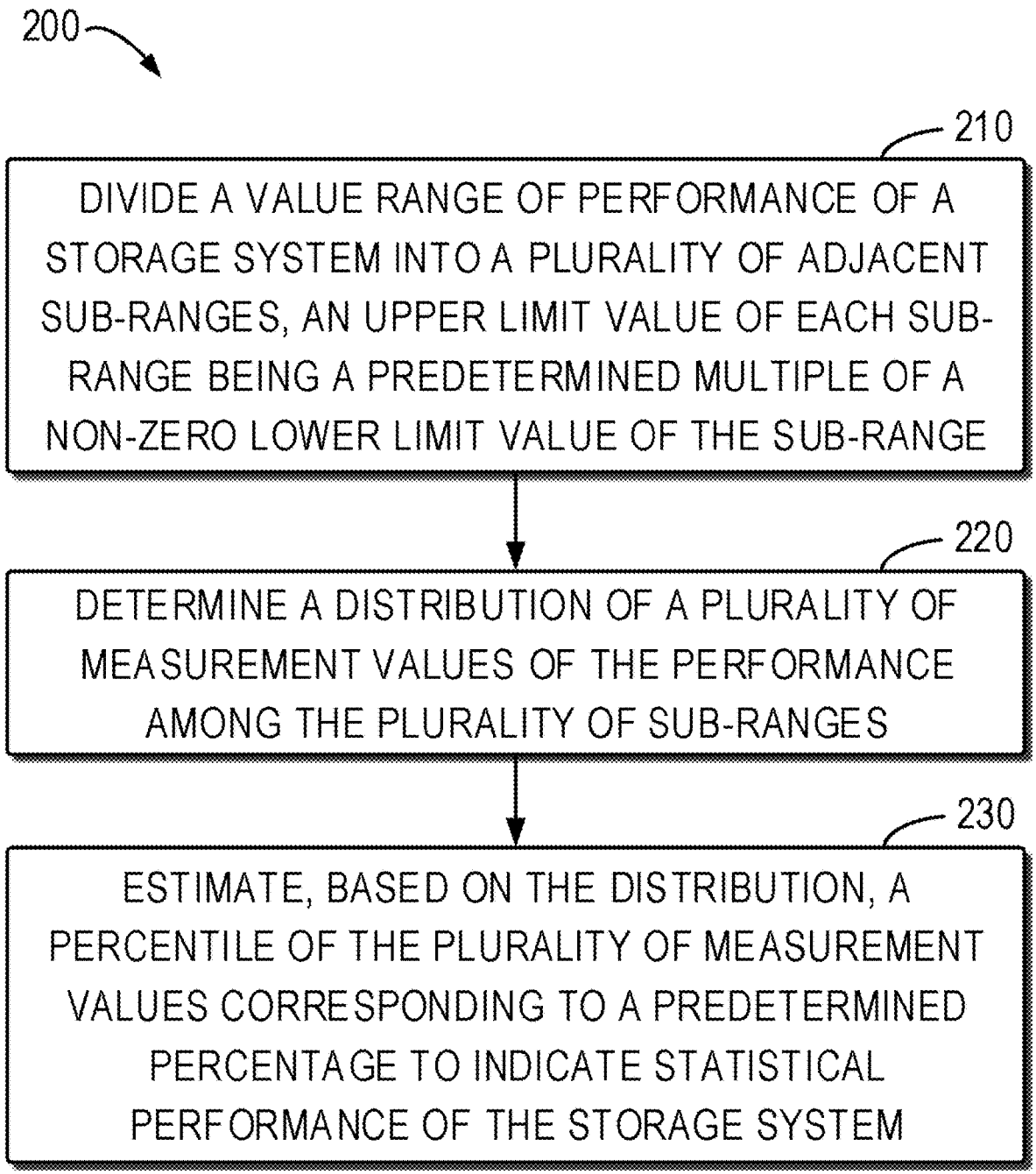
FIG. 2 illustrates a flowchart of an example method in accordance with embodiments of the present disclosure.

FIG. 2 illustrates a flowchart of an example method 200 in accordance with embodiments of the present disclosure. In some embodiments, the method 200 may be implemented by the computing device 120 in the storage system environment 100. For example, the method 200 may be implemented by a processor or a processing unit of the computing device 120 or various function modules of the computing device 120. In other embodiments, the method 200 may also be implemented independent of the computing device of the storage system environment 100 or may be implemented by other units or modules in the storage system environment 100.

At 210, the computing device 120 divides a value range of performance of the storage system 110 into a plurality of adjacent sub-ranges. It will be understood that the storage system 110 may have many performance indicators reflecting performance of the storage system 110 in various aspects. For example, these performance indicators may include, but not limited to: durability, consistency, availability, operational delay (for read operations, write operations and/or other operations), throughput rate, addressing time, space utilization rate, and scalability and input/output operations per second (IOPS), and so on. Normally, these performance indicators may be measured or represented by specific values having a value range. For example, the operation delay of the storage system 110 may be represented in microseconds (μs) and its value often ranges from several microseconds to millions of microseconds, or the like.

By dividing the value range of the performance into a plurality of sub-ranges, each sub-range may include a plurality of measurement values of the performance of the storage system 110. This is advantageous for analyzing and obtaining statistical values of the performance of the storage system 110, namely, statistical performance. In order to better obtain the statistical performance of the storage system 110, it may be advantageous that the computing device 120 divides the value range into the plurality of sub-ranges in a consistent manner. For example, the computing device 120 may set an upper limit value and a lower limit value of each sub-range to increase according to the same factor. That is, the upper limit value and the lower limit value of each sub-range are obtained according to an exponential function with a base of the factor.

In other words, for each sub-range, if its lower limit value is a non-zero value, then the upper limit value of the sub-range may be set to a predetermined multiple (namely, the above factor) of the lower limit value. However, in some cases, the performance value of the storage system 110 may be zero, that is, the lower limit value of a certain sub-range of the plurality of sub-ranges may be zero. In this event, the computing device 120 may set the upper limit value of the sub-range as a predetermined non-zero value, for example, one. It will be understood that the specific upper limit values and lower limit values of the sub-ranges described herein are exemplary only and are not intended to limit the scope of the embodiments of the present disclosure in any manners. In other embodiments, when the lower limit value of a sub-range is zero, its upper limit value may be set to any non-zero value.

In some embodiments, operations related to the sub-ranges may be simplified by setting the upper limit value and the lower limit value of each sub-range to integers, and the storage space for storing the upper limit values and the lower limit values of the sub-ranges can be saved. Accordingly, when dividing a value range into a plurality of sub-ranges, the computing device 120 may round the upper limit value and the lower limit value of each sub-range. After the rounding, two or more sub-ranges which originally have different upper limit values and different lower limit values may have the same lower limit value and the same upper limit value. Under this circumstance, the computing device 120 may combine a plurality of sub-ranges having the same upper limit value and the same lower limit value because of rounding into a single sub-range, to avoid producing duplicate sub-ranges and causing unnecessary waste of system resources. A specific example of creating a plurality of sub-ranges in accordance with embodiments of the present disclosure is described below with reference to FIG. 3.

Figure 3:
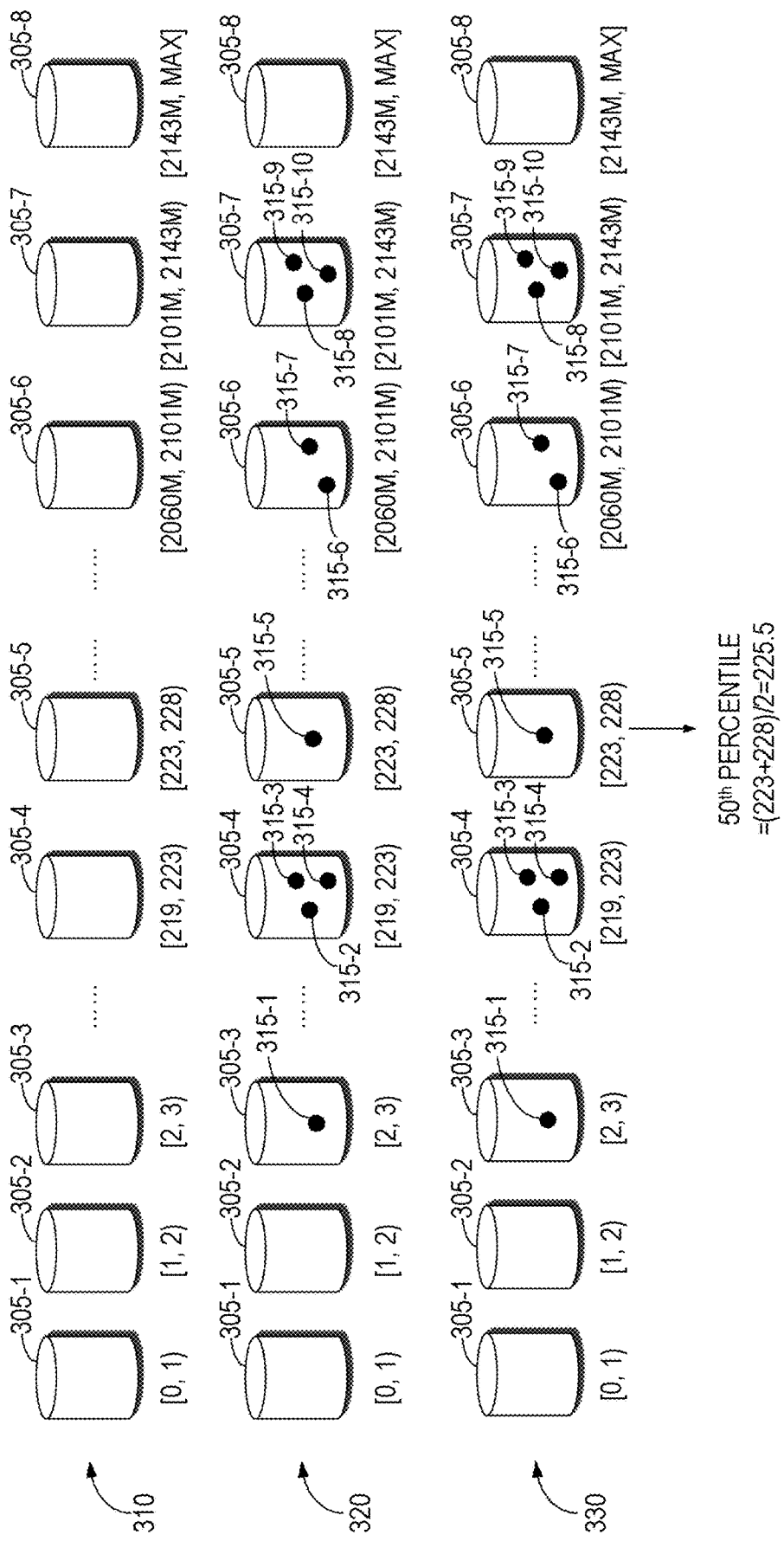
FIG. 3 illustrates a schematic diagram of estimating a percentile of a plurality of measurement values by creating a plurality of sub-ranges in accordance with embodiments of the present disclosure.

FIG. 3 illustrates a schematic diagram of estimating a percentile of a plurality of measurement values 315 by creating a plurality of sub-ranges 305 in accordance with embodiments of the present disclosure. In the example of FIG. 3, it is assumed that the value of the performance (for example, a read/write delay) of the storage system 110 ranges from a minimum value 0 to a maximum value MAX. As illustrated, at 310, for such a value range, the computing device 120 may create a plurality of sub-ranges (hereinafter referred to as sub-ranges 305) including sub-ranges 305-1 to 305-8. For ease of understanding, in FIG. 3, the sub-ranges 305 are depicted in a shape of bucket, while measurement values 315 of the performance of the storage system 110 are depicted in a dot shape. If a measurement value belongs to a certain sub-range, the dot representing the measurement value may be depicted as being put into the bucket denoting the sub-range. Therefore, the sub-ranges 305 may also be known as buckets 305 in the following description.

In the specific example illustrated in FIG. 3, the upper limit value of a sub-range 305 is set to be 1.02 multiples of the lower limit value, and the upper and lower limit values have been rounded and the duplication has been removed from the sub-ranges. As a result, a value interval of the sub-range 305-1 is [0, 1), a value interval of the sub-range 305-2 is [1, 2), a value interval of the sub-range 305-3 is [2, 3), a value interval of the sub-range 305-4 is [219, 223), a value interval of the sub-range 305-5 is [223, 228), a value interval of the sub-range 305-6 is [2060M, 2101M), a value interval of the sub-range 305-7 is [2101M, 2143M), and a value interval of the sub-range 305-8 is [2143M, MAX), where M represent million (namely, $10^6$). In a specific implementation of the sub-range 305, the computing device 120 may create a first array to represent the sub-ranges 305, and the first array may be known as a sub-range array or a bucket array, where each array element is used for recording the upper limit value and the lower limit value of each sub-range 305.

Moreover, as shown in FIG. 3, each sub-range 305, except for the last sub-range 305-8, is closed at the lower limit value and is open at the upper limit value. It means that if a measurement value equals exactly to the lower limit value of a certain sub-range, the measurement value can be put into the sub-range. If a measurement value equals exactly to the upper limit value of a certain sub-range, the measurement value can be put into a following sub-range adjacent to the sub-range. However, it will be appreciated that it is just an example that each sub-range 305 is closed at the lower limit value and is open at the upper limit level, without suggesting any limitation to the scope of the present disclosure in any manners. In other embodiments, each sub-range 305 may be open at the lower limit value and may be closed at the upper limit value, or each sub-range 305 may be individually configured to be open or closed at the upper limit value or the lower limit value.

Referring back to FIG. 2, at 220, the computing device 120 determines a distribution of a plurality of measurement values of the performance of the storage system 110 among a plurality of divided sub-ranges. It will be understood that the computing device 120 may determine the above distribution in any suitable manners. For example, the computing device 120 may determine which measurement values are contained in each of the plurality of sub-ranges one by one. For another example, the computing device 120 may determine the measurement values contained in each sub-range according to any other sequences. For a further example, the computing device 120 may determine the minimum value and the maximum value in the plurality of measurement values, then exclude the sub-ranges in which it is impossible to include the measurement values, and determine measurement values contained in the sub-ranges having at least one measurement value.

In other embodiments, the computing device 120 may set an associated counter for each sub-range to record the number of measurement values included in the sub-range. In a specific implementation, the computing device 120 may create a second array to implement a plurality of counters corresponding to the plurality of sub-ranges. The second array may be referred to as a count array, in which each array element is used for recording the number of measurement values included in the corresponding sub-range.

In this event, for each of the plurality of measurement values, the computing device 120 may determine a sub-range including the measurement value from the plurality of sub-ranges. For example, upon obtaining a new measurement value of the storage system 110, the computing device 120 may determine, from the plurality of sub-ranges, the sub-range to which the new measurement value belongs. Next, the computing device 120 may increase incrementally the counter associated with the determined sub-range, for example, increasing the count value of the counter corresponding to the sub-range by 1. After the above procedure is performed on each of the plurality of measurement values, the computing device 120 may determine the number of measurement values included in each sub-range, namely, the distribution of the plurality of measurement values among the plurality of sub-ranges. In this way, the computing device 120 can timely distribute a newly obtained measurement value into a corresponding sub-range, and timely determine a latest count of measurement values included in each sub-range.

When determining the sub-range to which a certain measurement value belongs, the computing device 120 may employ any suitable approaches. For example, since the respective sub-ranges are arranged adjacent to each other according to the order of magnitude within the value range of the measurement values, the computing device 120 may compare a measurement value with the upper limit values of a plurality of sub-ranges one by one following the sequence of the upper limit values of the sub-ranges from small to large. If the measurement value is below an upper limit value of a certain sub-range, the computing device 120 may determine that the measure value belongs to the sub-range. Alternatively, the computing device 120 may also compare the measurement value with the lower limit values of a plurality of sub-ranges one by one following the sequence of the lower limit values of the sub-ranges from large to small. If the measurement value is greater than a lower limit value of a certain sub-range, the computing device 120 may determine that the measurement value belongs to the sub-range.

In other embodiments, given the nature that the respective sub-ranges are arranged adjacent to each other according to the order of magnitude within the value range of the measurement values, the computing device 120 may search, from a plurality of sub-ranges, a sub-range to which a certain measurement value belongs using a binary search algorithm. In this way, the computing device 120 may improve the speed and efficiency of searching the sub-range in which a measurement value is positioned and can lower complexity of the search algorithm. The distribution of a plurality of measurement values among a plurality of sub-ranges is explained below with a specific example with reference to FIG. 3.

As illustrated at 320 of FIG. 3, the computing device 120 may determine the distribution of the plurality of measurement values 315 among the sub-ranges 305 through any manners described above. Specifically, a measurement value 315-1 belongs to the sub-range 305-3, measurement values 315-2, 315-3 and 315-4 belong to the sub-range 305-4, a measurement value 315-5 belongs to the sub-range 305-5, measurement values 315-6 and 315-7 belong to the sub-range 305-6, and measurement values 315-8, 315-9 and 315-10 belong to the sub-range 305-7. It will be appreciated that the specific number of measurement values shown herein is an example only and does not suggest any limitation to the scope of the embodiments of the present disclosure in any manners. In other embodiments, the computing device 120 may determine a distribution of any number of measurement values among the sub-ranges 305.

Referring back to FIG. 2, at 230, the computing device 120 estimates, based on the distribution of the plurality of measurement values among the plurality of sub-ranges, a percentile of the plurality of measurement values corresponding to a predetermined percentage to indicate statistical performance of the storage system 110. In some embodiments, the predetermined percentage may be set by technical staff or users based on a specific technical environment and an application scenario. For example, the predetermined percentage may be set as a percent advantageous to reflecting the statistical performance of the storage system 110, such as, 10%, 25%, 30%, 50%, 75%, 80%, 90%, 99% or 99.9%, and so on. More generally, the predetermined percentage may be set to any percent.

In some embodiments, in order to estimate a percentile corresponding to the predetermined percentage, the computing device 120 may first determine the number of the plurality of measurement values. For example, in case a plurality of counters are respectively used for recording the numbers of measurement values included in the plurality of sub-ranges, the computing device 120 may determine a plurality of count values of the plurality of counters associated respectively with the plurality of sub-ranges. Afterwards, the computing device 120 may obtain, based on the determined plurality of count values, the number of the plurality of measurement values, for example, by summing these count values. In this way, the count of the counter corresponding to each sub-range may be taken full advantage of. It should be understood that, in other embodiments, the computing device 120 may determine the number of the plurality of measurement values through other suitable ways. For example, the computing device 120 may directly count the performed measurements. As another example, the computing device 120 may obtain the number of the measurement values from a performance counter system of the storage system 100 for providing the measurement values.

After determining the number of the measurement values, the computing device 120 may determine, based on the number of the measurement values and the predetermined percentage, a sequence number of the percentile in the plurality of measurement values. For example, assuming that the number of the measurement values is 100 and the predetermined percentage is 80%, an sequence number of the percentile in the 100 measurement values to be estimated is 100×80%=80. For another example, assuming that the number of measurement values is 328 and the predetermined percentage is 90%, an sequence number of the percentile in the 328 measurement values to be estimated is 328×90%=296 (rounded). Because the measurement values are distributed among the sub-ranges according to the order of magnitude, the computing device 120 may determine the sub-range to which the percentile belongs by determining the sequence number of the percentile.

That is, the computing device 120 may determine, from the plurality of sub-ranges, a target sub-range including the percentile, based on the sequence number of the percentile in the plurality of measurement values. Since the percentile belongs to the target sub-range, meaning that the percentile is greater than the lower limit value of the target sub-range and below the upper limit value of the target sub-range, the upper limit value and the lower limit value of the target sub-range may be used for estimating the percentile. In other words, the computing device 120 may obtain an estimated value of the percentile, based on the upper limit value and lower limit value of the determined target sub-range. In this way, the computing device 120 only needs to determine the sequence number of a percentile in the plurality of measurement values and the sub-range to which the percentile is positioned without determining that the percentile is which one of the measurement values, thereby reducing the amount of calculations for determining the percentile.

The computing device 120 may use various manners to obtain the estimated value of the percentile based on the upper limit value and the lower limit value of the target sub-range. In some embodiments, the computing device 200 may directly use the upper limit value or the lower limit value of the target sub-range as the estimated value of the percentile, thereby saving the amount of calculations for calculating the estimated value. More generally, the computing device 120 may take any value in the target sub-range (namely, a value between the lower limit value and the upper limit value of the target sub-range) as the estimated value of the percentile, which also saves calculations for the estimated value. In other embodiments, the computing device 120 may calculate an average value of the upper limit value and the lower limit value of the target sub-range as the estimated value of the percentile. In this way, an error of the estimated value of the percentile can be reduced.

In FIG. 3, a specific example is depicted at 330 to explain how the computing device 120 estimates the percentile. Specifically, through querying counters corresponding to sub-ranges 305, the computing device 120 may first determine that a total number of the plurality of measurement values 315 is 10. In this example, assuming that the predetermined percentage is set to 50%, and then based on the number (namely, 10) of the measurement values 315 and the predetermined percentage 50%, the computing device 120 may determine that a sequence number of the 50$^{th}$ percentile in the 10 measurement values is 5. Then, based on the sequence number 5 of the percentile, the computing device 120 may determine that the percentile is positioned in the sub-range 305-5, that is, the target sub-range is the sub-range 305-5. Afterwards, the computing device 120 may take the average value (for example, 223+228/2=225.2) of the upper limit value and the lower limit value of the target sub-range 305-5 as the estimated value of the 50th percentile.

In this case, a relative error of the estimated value of the percentile with respect to the actual percentile in fact depends on a ratio of the upper limit value to the lower limit value of each sub-range. Therefore, in some embodiments, a predetermined multiple of the upper limit value relative to the lower limit value for each sub-range may be determined based on the relative error of the percentile. Specifically, when a value range of the performance of the storage system 110 is divided into a plurality of sub-ranges, the computing device 120 may first determine a tolerable relative error of the estimated percentile. For example, the relative error may be predetermined by technical staffs or users based on a specific technical environment and an application scenario. Then, the computing device 120 may determine, based on the relative error, the predetermined multiple of the upper limit value relative to the lower limit value for each sub-range. For example, assuming that the predetermined relative error is $E_R$ (for example, $0<E_R<1$), then a multiple of the upper limit value relative to the lower limit value for each sub-range may be set as $1+2E_R$.

On this basis, assuming x is the actual percentile and y is the lower limit value of the target sub-range. As a result, the upper limit value of the target sub-range is $y(1+2E_R)$. As the actual percentile is within the target sub-range, then $y \leq x \leq y(1+2E_R)$. In case the average value serves as the estimated value of the percentile, the estimated value of the percentile is $y(1+2E_R)$. Therefore, the relative error E may be represented as following equation (1):

$$E = \frac{|x - y(1 + E_R)|}{x} \leq E_R * \frac{y}{x} \leq E_R \quad (1)$$

That is, if the tolerable relative error is $E_R$, the upper limit value can be $1+2E_R$ multiple of the lower limit value for each sub-range. After the predetermined multiple is determined based on the tolerable relative error $E_R$, the computing device 120 may determine, based on the value range of the performance of the storage system 110 and the predetermined multiple, the upper limit value and the lower limit value of each sub-range.

Compared to the traditional approaches for calculating a performance percentile, system resources (for example, memory resources or computing resources) occupied by embodiments of the present disclosure are greatly reduced. Specifically, as demonstrated by the following calculation, embodiments of the present disclosure require a space complexity of about O (log MAX) when calculating the estimated value of the percentile, where MAX represents the maximum value in the measurement values. To simplify the calculation, it is assumed that the measurement values are integers and a point b is used to represent where duplicate sub-ranges no longer appear after the upper limit value and the lower limit value of the exponentially growing sub-range are rounded. If $b+1 \geqslant b(1+2E_R)$, memory overheads occupied by both the sub-range array and the count array can be represented by following equation (2):

$$O = 2 * \left( \frac{1}{2E_R} + \log_{1+2E_R}^{MAX} - \log_{1+2E_R}^{\frac{1}{2E_R}} \right) = \frac{1}{E_R} + 2\log_{1+2E_R}^{2MAXE_R} \quad (2)$$

Furthermore, it is assumed that a binary search algorithm is used for searching the sub-range to which a certain measurement value belongs, then a time complexity for putting a new measurement value into a certain sub-range is 0 (log N), where N represents the number of sub-ranges. In addition, assuming that each sub-range has a corresponding counter to count the number of measurement values included in the sub-range, and then the sub-range where the percentile is positioned may be determined by summing count values in the count array representing the counters. Accordingly, the time complexity for calculating the estimated value of the percentile is also O (N), where N represents the number of buckets. Therefore, compared with the traditional approaches for calculating the performance percentile, embodiments of the present disclosure continue to occupy fewer memory resources even if the number of the measurement values is huge.

Figure 4:
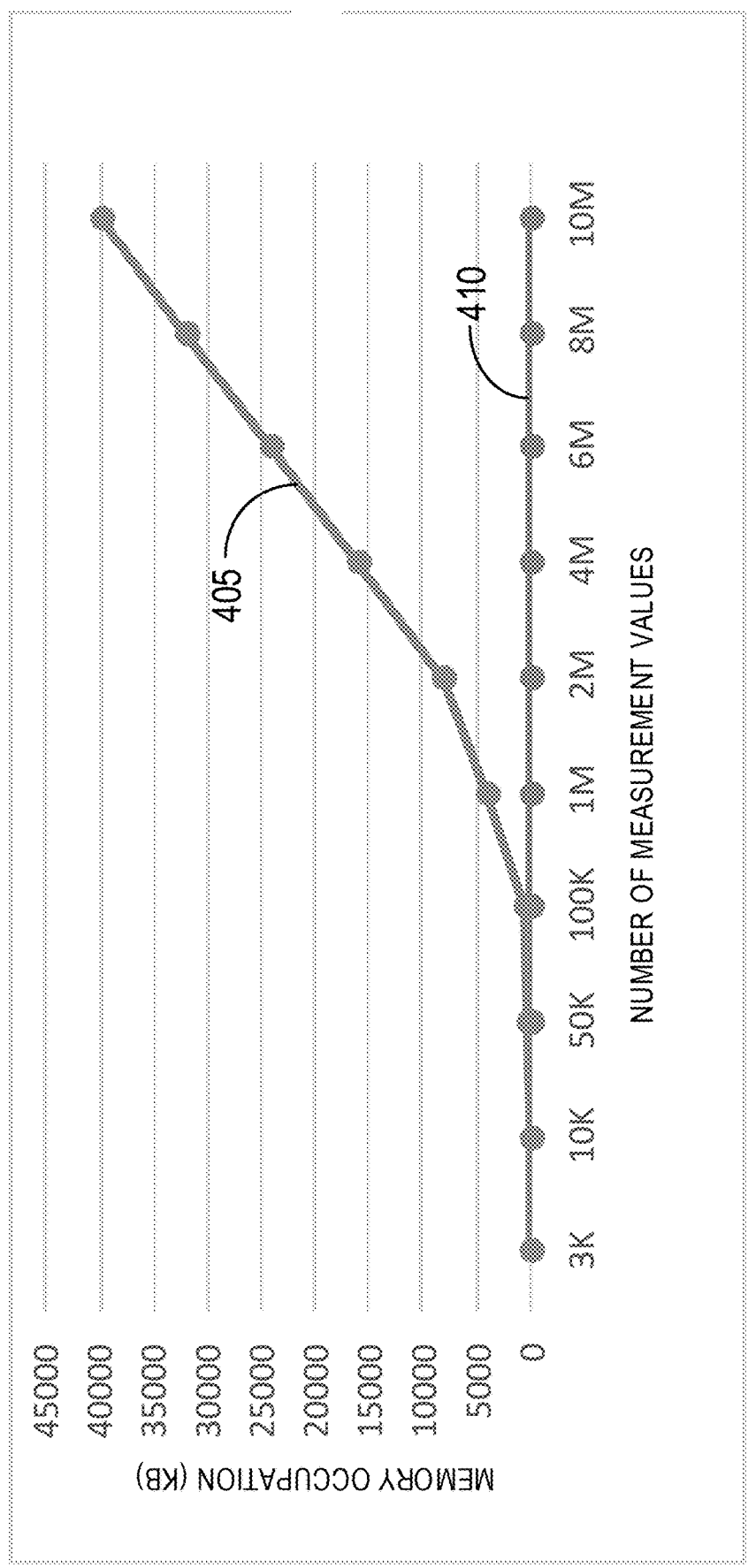
FIG. 4 illustrates a simulation diagram of a comparison between memory resource occupation in accordance with embodiments of the present disclosure and memory resource occupation of a traditional solution.

FIG. 4 illustrates a simulation diagram of a comparison between memory resource occupation in accordance with embodiments of the present disclosure and memory resource occupation of a traditional solution. In FIG. 4, the horizontal axis represents the number of the measurement values, where K denotes one thousand (namely, $10^3$) and M represents million (namely, $10^6$). The longitudinal axis represents memory occupation in kilobytes (KB). In the simulated example, the acceptable relative error of the percentile is set to 0.38%, and the maximum value of the performance of the storage system 110 is configured as a maximum value representable by an integer variable.

In FIG. 4, a curve 405 represents a curve of memory resource occupation changing with the number of the measurement values in the traditional solution, while a curve 410 represents a curve of memory resource occupation changing with the number of the measurement values in embodiments of the present disclosure. As shown in the curve 405, the memory occupation in the traditional solution increases dramatically as the number of the measurement values increases. For example, when the number of the measurement values is 10 million (10M), the traditional solution will consume the memory resources of approximately 40 thousand KB. In contrast, as illustrated by the curve 410, despite the growth of the number of the measurement values, the memory space used by 2326 sub-ranges in accordance with embodiments of the present disclosure barely changes and the memory resources of only 18.6 KB are occupied, because it is only required to store the upper and lower limit values of each sub-range and the number of the measurement values in each sub-range.

On the other hand, as represented by above equation (1), the method for estimating a percentile provided in the embodiments of the present disclosure can control the relative error of the estimated value of the percentile with respect to the actual percentile not exceeding a given acceptable error. In this regard, FIG. 5 illustrates a simulation diagram of relative errors of the estimated percentiles in accordance with embodiments of the present disclosure.

Figure 5:
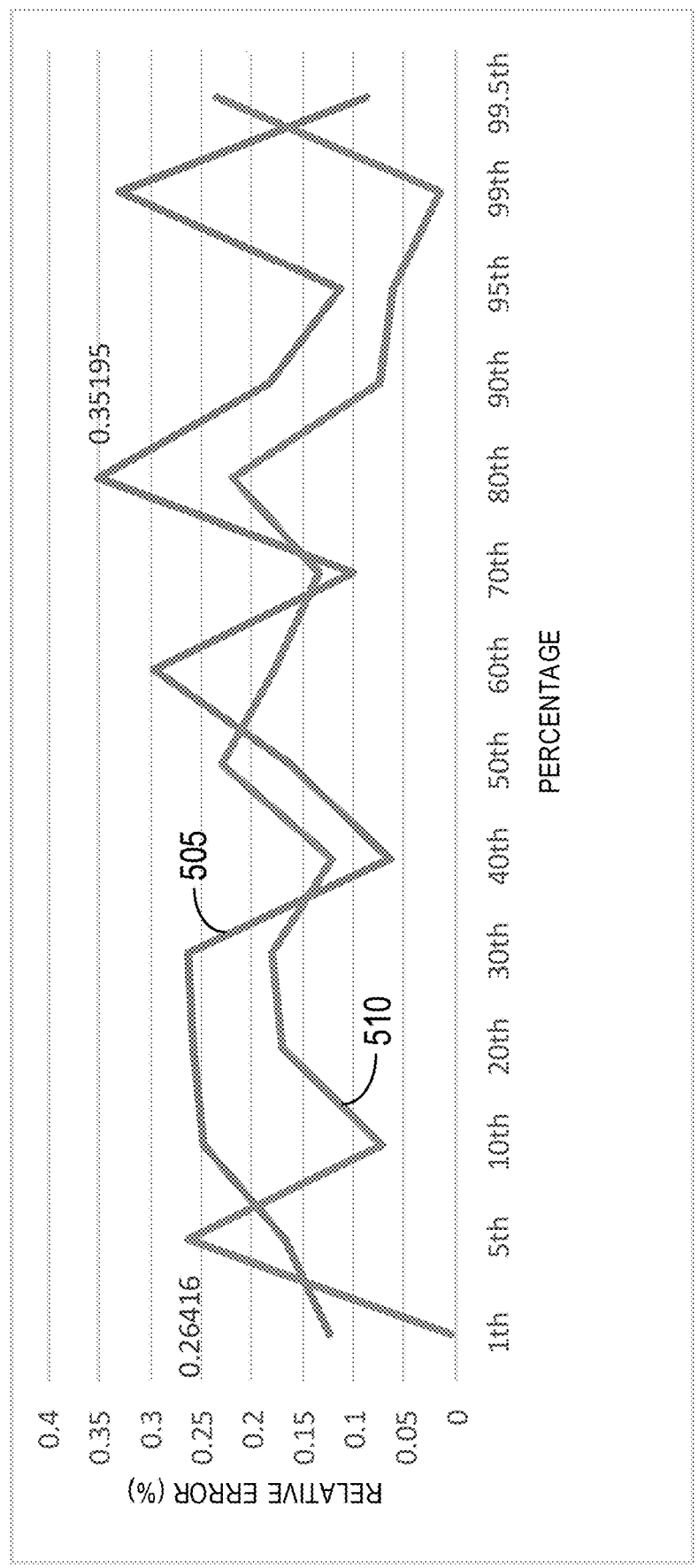
FIG. 5 illustrates a simulation diagram of relative errors of the estimated percentiles in accordance with embodiments of the present disclosure.

In FIG. 5, the horizontal axis represents percentages corresponding to the percentiles while the longitudinal axis represents relative errors of the estimated values of the percentiles with respect to the actual percentiles. A curve 505 represents a relative error curve when the tolerable relative error is set to 0.38%, and a curve 510 represents a relative error curve when the tolerable relative error is set to 0.28%.

In addition, in the simulated example shown in FIG. 5, one million random values are distributed into the constructed sub-ranges to simulate the measurement values. According to the curve 505, when the tolerable relative error is set to 0.38%, an error peak value occurs approximately at a percentile corresponding to a percentage of 80%, that is, 0.35195%. As can be seen from the curve 510, when the tolerable relative error is set to 0.28%, an error peak value occurs approximately at a percentile corresponding to a percentage of 5%, that is, 0.26416%. Therefore, the relative errors of estimated values of the percentile for all percentages are not greater than the given tolerable relative error.

It can be seen from the simulation results of FIGS. 4 and 5, the solution for calculating the estimated value of the percentile provided by the embodiments of the present disclosure are efficient in terms of an utilization of system resources (for example, memory resources or computing resources) and can be used for determining statistical performance of a storage system, so as to track performance issues of the storage system. Compared with the traditional approaches for calculating the performance percentile, embodiments of the present disclosure remain to occupy fewer system resources and still can provide a performance percentile within a given relative error, even if the number of the performance measurement values is huge.

Figure 6:
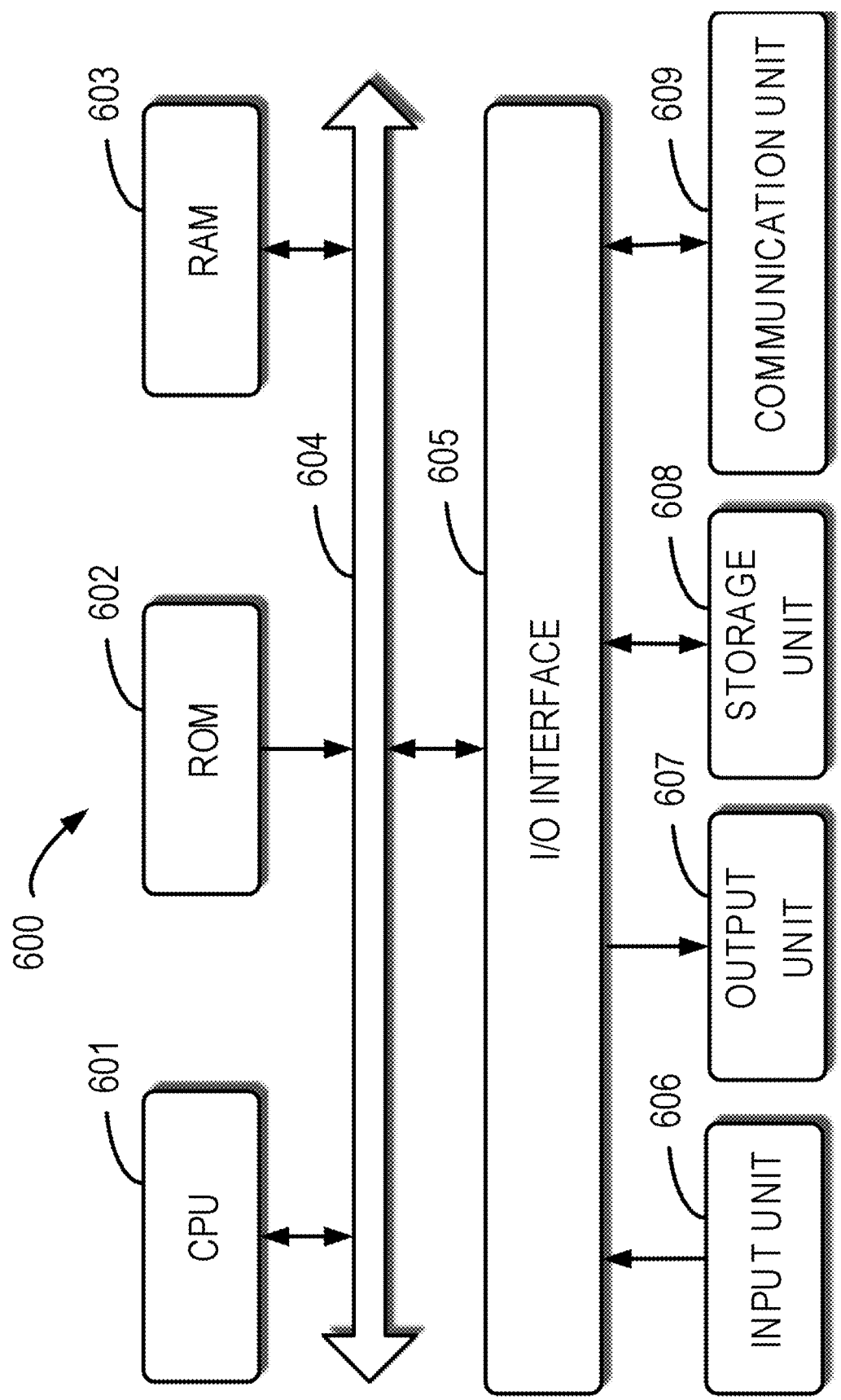
FIG. 6 illustrates a schematic block diagram of a device that can be used for implementing embodiments of the present disclosure.

FIG. 6 schematically illustrates a block diagram of a device 600 for implementing embodiments of the present disclosure. In some embodiments, the device 600 may be an electronic device, which can be used for implementing the computing device 120 in FIG. 1. As shown in FIG. 6, the device 600 includes a central process unit (CPU) 601, which can execute various suitable actions and processing based on the computer program instructions stored in the read-only memory (ROM) 602 or computer program instructions loaded in the random-access memory (RAM) 603 from the storage unit 608. The RAM 603 may also store all kinds of programs and data required by the operation of the device 600. The CPU 601, ROM 602 and RAM 603 are connected to each other via a bus 604. An input/output (I/O) interface 605 is also connected to the bus 604.

A plurality of components in the device 600 is connected to the I/O interface 605, including: an input unit 606, such as a keyboard, a mouse and the like; an output unit 607, for example, various kinds of displays and loudspeakers etc.; a storage unit 608, such as a disk and an optical disk etc.; and a communication unit 609, such as a network card, a modem, a wireless transceiver and the like. The communication unit 609 allows the device 600 to exchange information/data with other devices via a computer network, such as Internet, and/or various telecommunication networks.

The above described each procedure and processing, such as method 200, may be executed by the processing unit 601. For example, in some embodiments, the method 200 may be implemented as a computer software program tangibly included in the machine-readable medium, for example, the storage unit 608. In some embodiments, part or the entire computer program may be loaded and/or mounted to the device 600 via the ROM 602 and/or communication unit 609. When the computer program is loaded to the RAM 603 and executed by the CPU 601, actions in one or more blocks of the above describe method 200 can be implemented.

As used herein, the term "includes" and its variants are to be read as open-ended terms that mean "includes, but is not limited to." The term "based on" is to be read as "based at least in part on." The term "one embodiment" and "the embodiment" are to be read as "at least one embodiment." The terms "first", "second" and so on can refer to same or different objects. The following text also can include other explicit and implicit definitions.

As used herein, the term "determine" encompasses a variety of actions. For example, "determine" may include computing, calculating, exporting, researching, looking up (for example, looking up in a table, a database or a further data structure), and finding out etc. Additionally, "determine" may include receiving (for example, receiving information), accessing (for example, accessing data in a memory) and the like. Moreover, "determine" may include parsing, choosing, selecting and establishing etc.

It should be noted that embodiments of the present disclosure may be implemented by hardware, software or combinations of software and hardware. The hardware portion may be implemented by special logic; the software portion may be stored in a memory executed by a suitable instruction execution system, for example, a microprocessor or dedicated design hardware. Those skilled in the art can understand that the above device and method can be implemented by using computer executable instructions and/or including in the control codes of the processor, for example, providing such codes on the programmable memory or data carriers of optical or electronic signal carriers.

Further, although operations of the method of the present disclosure are described in a particular order in the drawings, it does not require or imply that these operations are necessarily performed according to this particular sequence, or a desired outcome can only be achieved by performing all shown operations. On the contrary, the execution order for the steps as depicted in the flowcharts may be varied. Additionally or alternatively, some steps can be omitted and a plurality of steps can be combined into one step for execution, and/or one step can be decomposed into a plurality of steps for execution. It should also be noted that features and functions of two or more apparatuses according to the present disclosure can be materialized in one apparatus whereas features and functions of one apparatus described above can be further divided and materialized by a plurality of apparatuses.

Although the present disclosure has been described with reference to several detailed embodiments, it should be understood that the present disclosure is not limited to the disclosed embodiments. The present disclosure is intended to cover various modifications and equivalent arrangements included in the spirit and scope of the appended claims. The scope of the appended claims meets the broadest explanations and covers all such modifications and equivalent structures and functions.

We claim:

1. A computer-implemented method, comprising:
    obtaining, by a system comprising a processor, a plurality of measurement values of performance of a storage system;
    dividing, by the system, a value range of the performance of the storage system into a plurality of adjacent sub-ranges, a respective upper limit value of each sub-range of the plurality of adjacent sub-ranges being a predetermined multiple of a respective non-zero lower limit value of the sub-range;
    determining, by the system, a distribution of the plurality of measurement values of the performance among the plurality of adjacent sub-ranges;
    estimating, by the system and based on the distribution, a percentile of the plurality of measurement values corresponding to a predetermined percentage to indicate a statistical performance of the storage system; and
    determining, by the system, a performance issue of the storage system based on the percentile of the plurality of measurement values.

2. The method of claim 1, wherein the dividing the value range into the plurality of adjacent sub-ranges comprises:
    determining a tolerable relative error for estimating the percentile;
    determining the predetermined multiple based on the tolerable relative error; and
    determining, based on the value range and the predetermined multiple, the respective upper limit value and the respective non-zero lower limit value for each sub-range.

3. The method of claim 1, wherein the dividing the value range into the plurality of adjacent sub-ranges comprises:
    rounding the respective upper limit value and the respective non-zero lower limit value for each sub-range; and
    combining a group of the plurality of adjacent sub-ranges having a same upper limit value and a same lower limit value after rounding into a single sub-range.

4. The method of claim 1, wherein the dividing the value range into the plurality of adjacent sub-ranges comprises:
    in response to a lower limit value of a sub-range of the plurality of adjacent sub-ranges being determined to be zero, setting an upper limit value of the sub-range to a predetermined non-zero value.

5. The method of claim 1, wherein the determining the distribution comprises:
    for each measurement value of the plurality of measurement values,
        determining a sub-range including the measurement value from the plurality of adjacent sub-ranges; and
        increasing incrementally a counter associated with the sub-range, the counter being used for recording a number of measurement values of the plurality of measurement values included in the sub-range.

6. The method of claim 5, wherein the determining the sub-range comprises:
    searching the sub-range using a binary search algorithm.

7. The method of claim 1, wherein the estimating the percentile comprises:
    determining a number of the plurality of measurement values;

determining, based on the number and the predetermined percentage, a sequence number of the percentile in the plurality of measurement values;

determining, from the plurality of adjacent sub-ranges, a target sub-range including the percentile based on the sequence number; and obtaining an estimated value of the percentile based on an upper limit value and a lower limit value of the target sub-range.

8. The method of claim 7, wherein the determining the number of the plurality of measurement values comprises:

determining a plurality of count values of a plurality of counters respectively associated with the plurality of adjacent sub-ranges, the plurality of counters being respectively used for recording the numbers of measurement values included in the plurality of adjacent sub-ranges; and obtaining the number of the plurality of measurement values based on the plurality of count values.

9. The method of claim 7, wherein the obtaining the estimated value comprises:

calculating an average value of the upper limit value and the lower limit value of the target sub-range as the estimated value.

10. An electronic device, comprising:

at least one processor; and at least one memory storing computer program instructions, the at least one memory and the computer program instructions being configured, with the at least one processor, to cause the electronic device to:

obtain a plurality of measurement values of performance of a storage system;

divide a value range of the performance of the storage system into a plurality of adjacent sub-ranges, a respective upper limit value of each sub-range being a predetermined multiple of a respective non-zero lower limit value of the sub-range;

determine a distribution of the plurality of measurement values of the performance among the plurality of adjacent sub-ranges;

estimate, based on the distribution, a percentile of the plurality of measurement values corresponding to a predetermined percentage to indicate a statistical performance of the storage system; and determine a performance issue of the storage system based on the percentile of the plurality of measurement values.

11. The electronic device of claim 10, wherein the at least one memory and the computer program instructions are configured, with the at least one processor, to cause the electronic device to divide the value range into the plurality of adjacent sub-ranges by:

determining a tolerable relative error for estimating the percentile;

determining the predetermined multiple based on the tolerable relative error; and determining, based on the value range and the predetermined multiple, the respective upper limit value and the respective non-zero lower limit value for each sub-range.

12. The electronic device of claim 10, wherein the at least one memory and the computer program instructions are configured, with the at least one processor, to cause the electronic device to divide the value range into the plurality of adjacent sub-ranges by:

rounding the respective upper limit value and the respective non-zero lower limit value for each sub-range; and combining a plurality of adjacent sub-ranges having a same respective upper limit value and a same respective non-zero lower limit value after rounding into a single sub-range.

13. The electronic device of claim 10, wherein the at least one memory and the computer program instructions are configured, with the at least one processor, to cause the electronic device to divide the value range into the plurality of adjacent sub-ranges by:

in response to a corresponding lower limit value of a selected sub-range of the plurality of adjacent sub-ranges being determined to be zero, setting the respective upper limit value of the selected sub-range to a predetermined non-zero value.

14. The electronic device of claim 10, wherein the at least one memory and the computer program instructions are configured, with the at least one processor, to cause the electronic device to determine the distribution by:

for each of the plurality of measurement values, determining a sub-range including the measurement value from the plurality of adjacent sub-ranges, the determining resulting in a determined sub-range; and increasing incrementally a counter associated with the determined sub-range, the counter being used for recording a number of measurement values included in the determined sub-range.

15. The electronic device of claim 14, wherein the at least one memory and the computer program instructions are configured, with the at least one processor, to cause the electronic device to determine the sub-range by:

searching the sub-range using a binary search algorithm, resulting in the determined sub-range.

16. The electronic device of claim 10, wherein the at least one memory and the computer program instructions are configured, with the at least one processor, to cause the electronic device to estimate the percentile by:

determining a number of the plurality of measurement values;

determining, based on the number and the predetermined percentage, a sequence number of the percentile in the plurality of measurement values;

determining, from the plurality of adjacent sub-ranges, a target sub-range including the percentile based on the sequence number; and obtaining an estimated value of the percentile based on a corresponding upper limit value and a corresponding lower limit value of the target sub-range.

17. The electronic device of claim 16, wherein the at least one memory and the computer program instructions are configured, with the at least one processor, to cause the electronic device to determine the number of the plurality of measurement values by:

determining a plurality of count values of a plurality of counters respectively associated with the plurality of adjacent sub-ranges, the plurality of counters being respectively used for recording numbers of measurement values included in the plurality of adjacent sub-ranges; and obtaining the number of the plurality of measurement values based on the plurality of count values.

18. The electronic device of claim 16, wherein the at least one memory and the computer program instructions are configured, with the at least one processor, to cause the electronic device to obtain the estimated value by:

calculating an average value of the corresponding upper limit value and the corresponding lower limit value of the target sub-range as the estimated value.

19. A computer program product being tangibly stored on a non-volatile computer-readable medium and comprising machine-executable instructions which, when executed, causing a machine to perform operations, comprising:
- obtaining, by a system comprising a processor, a plurality of measurement values of performance of a storage system;
- dividing a value range of the performance of the storage system into adjacent sub-ranges, an upper limit value of each sub-range being a defined multiple of a non-zero lower limit value of the sub-range;
- determining a distribution of the plurality of measurement values of the performance among the adjacent sub-ranges;
- estimating, based on the distribution, a percentile of the measurement values corresponding to a predetermined percentage to indicate a statistical performance of the storage system; and
- determining, by the system, a performance issue of the storage system based on the percentile of the plurality of measurement values.

20. The computer program product of claim 19, wherein the dividing the value range into the adjacent sub-ranges comprises:
- determining a tolerable relative error for estimating the percentile;
- determining the defined multiple based on the tolerable relative error; and determining, based on the value range and the defined multiple, the upper limit value and the non-zero lower limit value for each sub-range.

* * * * *